United States Patent [19]

Okai et al.

[11] 4,115,123

[45] Sep. 19, 1978

[54] SHALLOW RELIEF PHOTOPOLYMER PRINTING PLATE AND METHODS

[75] Inventors: Sakuo Okai, Kyoto; Shozo Tsuchida, Osaka, both of Japan

[73] Assignee: Napp Systems (USA), Inc., San Marcos, Calif.

[21] Appl. No.: 761,975

[22] Filed: Jan. 24, 1977

Related U.S. Application Data

[62] Division of Ser. No. 695,941, Jun. 14, 1976, abandoned.

[51] Int. Cl.² .................................................. G03C 1/68
[52] U.S. Cl. ........................................ 96/79; 96/86 P; 96/35.1; 101/467
[58] Field of Search ............... 96/39.1, 36.3, 36, 38.1, 96/79; 101/467

[56] References Cited

U.S. PATENT DOCUMENTS

| 3,157,505 | 11/1964 | Notley | 96/35.1 |
| 3,455,239 | 7/1969 | Smith | 96/36.3 |
| 3,523,503 | 8/1970 | O'Boyle et al. | 101/32 |
| 3,647,446 | 3/1972 | Alsup | 96/35.1 |
| 3,677,750 | 8/1972 | Mammino | 96/1 |
| 3,728,114 | 4/1973 | Futaki et al. | 96/29 L |

*Primary Examiner*—John D. Welsh
*Attorney, Agent, or Firm*—Hosier, Niro & Daleiden, Ltd.

[57] ABSTRACT

A shallow relief printing plate is disclosed having a polymerized layer of less than about 0.020 inch and which includes an array of small protuberances in non-image or background areas to prevent bottoming. Photopolymerizable elements, as well as processing techniques, are also disclosed for making such printing plates.

16 Claims, 4 Drawing Figures

SHALLOW RELIEF PHOTOPOLYMER PRINTING PLATE AND METHODS

This is a division of application Ser. No. 695,941, filed June 14, 1976 now abandoned.

BACKGROUND AND SUMMARY OF THE INVENTION

The present invention relates generally to photopolymerized printing plates useful in letterpress, and other similar printing operations. More specifically, the present invention relates to a shallow relief photopolymer printing plate and methods for producing and using such a plate.

Photopolymer printing plates have found widespread and successful use in letterpress printing processes, particularly in the newspaper industry. Conventional photopolymer plates hold many advantages over prior art, metal etched printing plates. For example, the time required to make the photopolymer plates is considerably shorter and, with the introduction of water developable photopolymers, problems relating to environmental contamination have been significantly reduced. In addition the photopolymer plates are much easier to handle than are the metal etched plates.

In spite of their widespread acceptance in the industry, photopolymer plates do suffer from the disadvantage of being relatively expensive, particularly when compared to the plates used in stereotype systems utilized by some of the large newspapers. Thus, there is a need in the industry for a less expensive photopolymer printing plate which will enable photopolymer printing systems to economically compete with existing stereotype systems.

Conventional photopolymer printing plates utilize photosensitive materials which are deposited on a supporting substrate such as metal or plastic. It has been found through experience that, in order to obtain acceptable printing quality, it is necessary that the photosensitive layer have a thickness greater than about 0.020 inch. When photopolymer plates having a photosensitive layer of less than about 0.020 inch are utilized in letterpress machines a "bottoming" (printing on white or background areas) occurs. Of course, such a bottoming effect is unacceptable and, therefore, the photopolymer printing plates heretofore used have required a relief thickness and therefore a photosensitive layer of at least 0.020 inch.

In accordance with the present invention, a photopolymer printing plate is provided having a photosensitive layer with a thickness substantially less than that of prior art printing plates. Thus, the cost of the printing plates manufactured in accord with the present invention is substantially less than that of conventional photopolymer printing plates. In addition, the printing plates of the present invention may be used on letterpress machines to produce printed material of high quality without bottoming in background areas.

Accordingly, the present invention is generally directed to a shallow relief printing plate comprising a photopolymerized layer which is supported on a substrate. The photopolymerized layer includes both raised image or "relief" areas and background areas, the background areas having an array of small protuberances thereon. In addition, the present invention is directed to photopolymerizable elements and methods for making and processing such elements to provide this shallow relief printing plate. Finally, the present invention is further directed to printing processes making use of the shallow relief printing plates disclosed herein.

BRIEF DESCRIPTION OF DRAWINGS

The novel features which are believed to be characteristic of the invention are set forth in the appended claims. The invention itself, however, together with further objects and attendant advantages thereof, will be best understood by reference to the following description taken in connection with the accompanying drawings, in which:

Figure 2:
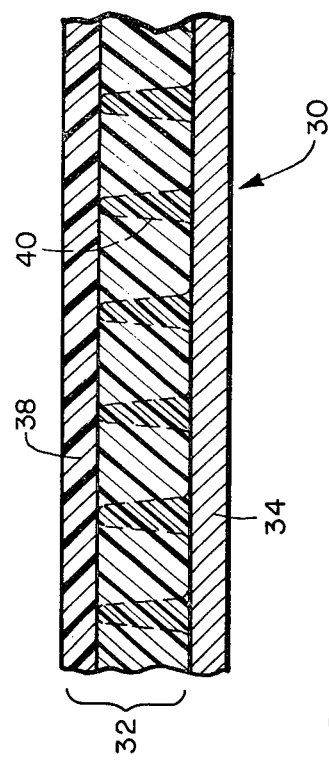
FIG. 2 is a cross-sectional view of a photopolymerizable element which may be utilized in accordance with the present invention to provide a shallow relief printing plate.
Figure 3:
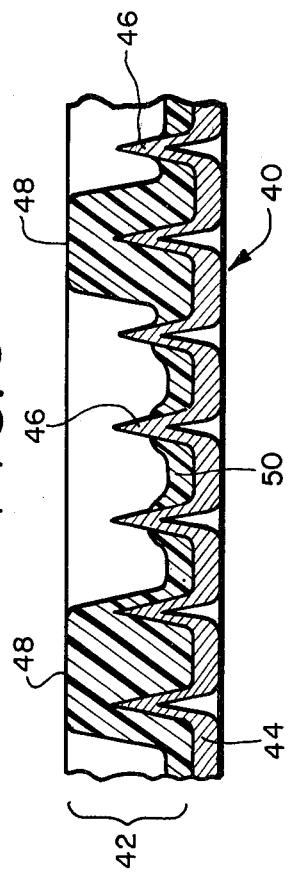
FIG. 3 is also an enlarged cross-sectional view illustrating an alternative embodiment of the shallow relief printing plate.
Figure 1:
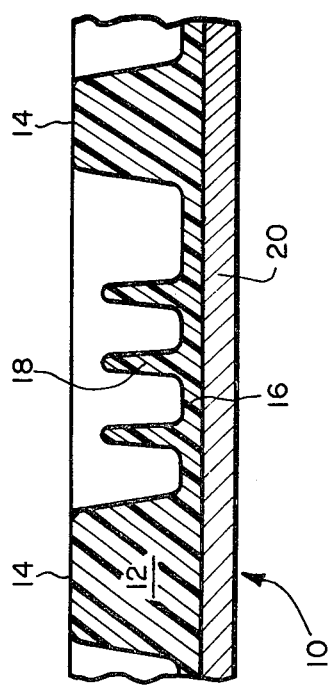
FIG. 1 is an enlarged cross-sectional view of a shallow relief printing plate made in accordance with the present invention.

It should be noted that FIGS. 1, 2 and 3 are primarily illustrative representations, and the sizes and shapes of the various layers, substrates and other components shown therein are not intended to limit the scope of the invention as further described hereinbelow and as set forth in the appended claims.

DETAILED DESCRIPTION OF THE INVENTION

The shallow relief printing plate of the present invention comprises a photopolymerized layer supported on a substrate. The photopolymerized layer includes raised image areas and background areas, the background areas having an array of small protuberances thereon. These small protuberances are hereinafter generally referred to as "protrudent dots". Referring now to FIG. 1, the shallow relief printing plate 10 has a layer 12 which has been photopolymerized and developed with a suitable solvent to provide raised image areas 14 and background areas 16. In accordance with the present invention, the background areas 16 also include an array of small protrudent dots 18. The photopolymerized layer 12 is supported on a suitable substrate 20 which may be a metal, plastic or paper sheet or other material well known to those skilled in the art. In accordance with the present invention, the photopolymerized layer 12 has a thickness of less than 0.020 inch and, most preferably, has a thickness in the range of from about 0.005 to about 0.015 inch. It will be appreciated by those skilled in the art that a photopolymer printing plate having relief images with a height of less than about 0.020 inch will be subjected to bottoming during the printing process on conventional letterpress machines. However, the shallow relief printing plate described herein, by virtue of the protrudent dots 18 disposed in its background areas, prevents bottoming during the printing process thereby enabling the use of substantially thinner photopolymerized layers which, in turn, substantially reduces the cost of manufacturing the plate.

As can be clearly seen in FIG. 1, it is preferred that the height of the protrudent dots 18 be less than that of the relief image areas 14. This arrangement helps to minimize the printing of dots in the background areas while still preventing the undesirably bottoming effect. Most preferably, the height of the protrudent dot 18 is about 0.004 inch less than that of the raised image areas 14. While the distribution density of the protrudent dots 18 may vary over a wide range, the background areas 16 should include at least one dot per square centimeter and preferably from about 100 to about 700 protrudent dots per square centimeter. In addition, the transverse dimension of the protrudent dots 18 should be less than about 0.008 inch and preferably in the range from about 0.001 to about 0.004 inch.

Figure 4:
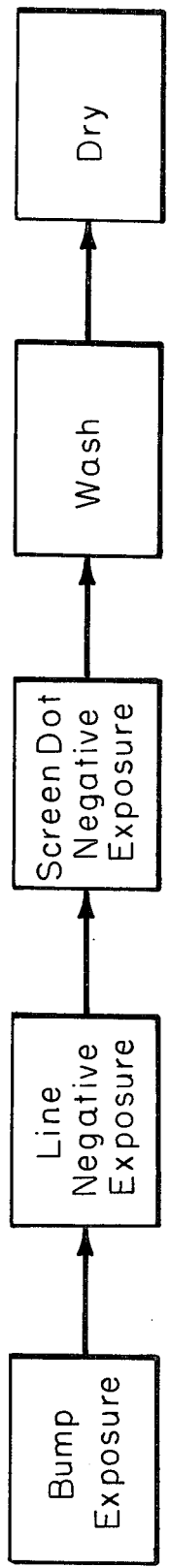
FIG. 4 is a flow diagram illustrating a preferred process for developing the photopolymer printing plate illustrated in FIG. 1.

Referring now to FIG. 4, the shallow relief printing plate illustrated in FIG. 1 may be produced by employing the following sequence of processing steps. First, a shallow relief photopolymerizable element having a photopolymer layer of less than about 0.020 inch is subjected to the conventional pre-conditioning. Such conditioning reduces the presence of oxygen in the photopolymer layer 12 thereby obviating the polymerization inhibition which oxygen effects during line negative exposure of the photopolymer to actinic light. This pre-exposure treatment may be effected by $CO_2$ conditioning or by a brief light exposure or "bump exposure" prior to the imagewise exposure. Thus, as shown in FIG. 4, the shallow relief photopolymerizable element is subjected to a bump exposure and subsequently to a line negative exposure as is conventional in the prior art.

In accordance with the present invention the shallow relief photopolymerizable element is next subjected to an exposure across its entire surface area to polymerizing small, discreet portions of the photopolymer which were not exposed during the line negative exposure, i.e., in the background areas. This may be conveniently accomplished by exposing the element to actinic light through a screen dot negative. Next, the thus exposed element is subjected to a conventional washing step to remove from the element the nonexposed portions of the photopolymer, thereby providing the relief image areas and background areas having protrudent dots thereon. Finally, the photopolymerized shallow relief element is subjected to a conventional drying step to provide a hard, dry and durable shallow relief printing plate.

The sequence of processing steps described hereinabove and illustrated in FIG. 4 is particularly preferred. Thus, it is desirable to utilize the screen dot negative exposure step subsequent to the line negative exposure step in order to provide a photopolymer printing plate having the highest possible quality. Utilization of the screen dot negative exposure step prior to line negative exposure, although possible, is not preferred since the use of the dot negative exposure first causes a loss of contact between the line negative and the photopolymer during line negative exposure due to photopolymerization shrinkage.

It will be appreciated that the photopolymerizable elements of this invention have a layer of photosensitive material substantially reduced in thickness as compared to conventional photopolymer elements. Accordingly, shorter exposure and washing steps may be employed in the developing processes for these elements, thereby saving the user of such elements both time and money.

In accordance with an alternative embodiment of the invention, a shallow relief photopolymer printing plate may be produced from the photopolymerizable element illustrated in FIG. 2. In this embodiment the photopolymerizable element 30 comprises a laminate 32 of photosensitive material supported by a substrate 34 which again may be a metallic, plastic or other conventional sheet material. The laminate 32 is composed of a first photopolymerizable layer 36 cast or molded adjacent to the substrate 34 and a second photopolymerizable layer 38 which is disposed over the first layer 36. In addition, the first layer 36 includes throughout its entire area an array of small, discreet polymerized portions 40. Accordingly, upon line negative exposure and washing of the element 30, the background areas of the resulting photopolymer printing plate will have protruding therefrom the polymerized portions 40 in much the same manner as the protrudent dots 18 extend from the background areas 16 of the printing plate illustrated in FIG. 1. Again, the photosensitive material, here comprising a laminate 32, has an overall thickness of less than about 0.020 inch and preferably in the range from about 0.005 to about 0.015 inch. The first photopolymerizable layer 36 has a thickness in the range from about 0.001 to about 0.014 inch, and the second layer 38 has a thickness in the range from about 0.001 to about 0.014 inch.

In order to produce the photopolymerizable element 30 the following sequence of processing steps may be followed. First, a photosensitive composition is deposited on a suitable substrate to a thickness in the range of from about 0.001 to about 0.014 inch, and preferably to a thickness of about 0.004 inch. This photopolymer layer is then subjected to a screen dot negative exposure in order to polymerize the small, discreet portions 40 throughout its entire area. Subsequently, and without subjecting the thus exposed layer 36 to any washing operation, a second photopolymer layer 38 is cast or molded thereon preferably to a thickness of about 0.003 inch.

The thus obtained laminated photopolymerizable element may be preconditioned, exposed to actinic light through a line negative, washed and dried in an entirely conventional manner to provide a shallow relief printing plate having protrudent dots in the background areas. This plate will function in a fashion similar to the shallow relief plate illustrated in FIG. 1.

The array of polymerized portions 40 in the element 30 preferably have the same characteristics as do the protrudent dots 18 of the printing plate 10. Thus, the distribution density of the polymerized portions 40 is at least one per square centimeter and preferably in the range of from about 100 to about 700 per square centimeter. In addition the polymerized portions have a transverse dimension of less than about 0.008 inch and preferably between about 0.001 and 0.005 inch. The height of the protrudent dots resulting from the development of element 30 and the difference between their height and that of the raised image areas will, of course, depend upon the thicknesses of the layers 36 and 38.

FIG. 3 illustrates still another embodiment for the present invention. In accord with this embodiment a photopolymerizable element is utilized comprising a layer of photosensitive composition supported on a metallic substrate, the substrate having formed therein an array of protrudent dots which extend into the photosensitive layer. Referring specifically to FIG. 3, a photopolymer printing plate 40 is shown having a photosensitive composition 42 deposited on a substrate 44 which includes an array of protrudent dots 46 which have been embossed therein. It will be appreciated by those skilled in the art that such a photopolymerizable element will provide, upon conventional development processing, a photopolymer printing plate which includes raised image areas 48 and background areas 50. Because of the dissolution and removal of nonexposed photopolymer from the background area 50 the embossed dots 46 will protrude in the background areas. Thus, through utilization of the photopolymerizable element described hereinabove, a shallow relief printing plate may be obtained which is similar to the plate illustrated in FIG. 1 with the exception that the protrudent dots of this embodiment comprise a part of the substrate, whereas the protrudent dots 18 in FIG. 1 comprise a portion of the photopolymerized layer. In accordance with this embodiment of the invention, the preferred density distribution of the protrudent dots is in the range of from about 50 to 200 per square centimeter and the preferred height of the dots 46 is in the range of from about 0.002 to about 0.005 inch.

It should be appreciated that the present invention is not directed to any specific photosensitive composition, support material or combinations thereof; rather, the present invention is directed to the utilization of any or all conventional photosensitive compositions and substrate materials in the manner disclosed herein to provide shallow relief printing plates. In addition, other conventional techniques such as the use of antihilation and adhesive layers, the etching or abrasion of substrate surfaces, the use of bump exposure or $CO_2$ conditioning, and post exposure curing and treatment of the printing plates may be used in conjunction with the shallow relief printing plates disclosed herein and their methods of production and use.

Practical embodiments of the present invention are illustratively shown in the following examples, wherein all percentages and parts are by weight unless otherwise indicated.

EXAMPLE 1

Partially saponified polyvinyl acetate (average degree of polymerization, 500; degree of saponification, 80.5 mol%, 70 parts), partially saponified polyvinyl acetate (average degree of polymerization, 500; degree of saponified, 88.5 mol%, 30 parts) and pure water (80 parts) are mixed and dissolved in a kneader at 90° C. to 95° C. for 30 minutes. After the temperature is lowered to 60° C., B-Hydroxyethyl methacrylate (100 parts) containing P-Methoxyphenol (0.2 parts), benzen isopropyl ether (2.5 parts) and trimethylolpropane trimethacrylate (8 parts) is dropwise added thereto in 40 minutes. The mixture is mixed with pure water (1 part) containing rose bengal dye (0.0025 part) and defoamed under reduced pressure to give a photosensitive resin composition.

EXAMPLE 2

The photosensitive resin composition obtained in Example 1 is spread on a support material treated by alodine 1200 (manufactured by Amchem Products, Inc.) and coated by a water soluble paint. A polyvinyl chloride sheet is placed thereon. The resulting piled material is passed between two rolls set up so as to provide a thickness of resin composition of about 10 mils. After cooling, the polyvinyl chloride sheet is peeled off and the resultant material is dried at 60° C. for 20 minutes to give a photopolymer plate.

EXAMPLE 3

The photopolymer plate obtained in Example 2 is bump exposed to the light of high pressure mercury lamp for 5 seconds from a distance of 70 cm. The plate is next put in contact with a screen negative (dot size about 3/1000" and a distribution density of about 700 per square centimeter), in a vacuum printing frame and exposed to the light of high pressure mercury lamp for 60 seconds, then the plate is put in contact with a line negative (half tone and letter) in a vacuum printing frame and exposed to the light of high pressure mercury lamp for 30 seconds. Then the plate is developed by spraying water and dried to 110° C. for 3 minutes to give a relief printing plate. The thus obtained relief printing plate has many protrudent dots in non-image areas. The height of dots are 1 to 3/1000 inch less than that of the image areas.

EXAMPLE 4

The photopolymer plate obtained in Example 2 is bump exposed to the light of high pressure mercury lamp for 5 seconds from a distance of 70 cm. Then the plate is put in contact with a screen negative (dot size about 3/1000 inch and distribution density of about 700 per square centimeter) in a vacuum frame and exposed to the light of high pressure mercury lamp for 60 seconds. The plate may then be packaged and shipped to a newspaper (customer). The customer makes a relief printing plate with protrudent dots in the non-image areas following the conventional developing procedures.

EXAMPLE 5

The photosensitive resin composition obtained in Example 1 is spread on a support material treated by alodine 1200 and coated by a water soluble paint. A polyvinyl chloride sheet is placed thereon. The resulting piled material is passed between two rolls to provide a thickness of resin composition of about 6 mils. After cooling, the polyvinyl chloride sheet is peeled off and the resultant material is dried at 60° C. for 15 minutes to give a photopolymer plate.

The thus obtained photopolymer plate is put in contact with a screen negative (dot size 5/1000 inch, distribution density of about 700 per square centimeter) in a vacuum printing frame and exposed to the light of a high pressure mercury lamp for 70 seconds. Then again the photosensitive resin composition obtained in Example 1 is spread on the plate and a polyvinyl chloride sheet is placed thereon. The resulting piled material is passed between two rolls set up to provide a thickness of the resin composition laminate totalling about 10 mils. After cooling, the polyvinyl chloride sheet is peeled off and the resultant material is dried at 60° C. for 15 minutes to give a photopolymer plate.

The thus obtained photopolymer plate is bump exposed to the light of a high pressure mercury lamp for 5 seconds from a distance of 70 cm. The plate is put in contact with a negative in a vacuum printing frame and exposed to light of a high pressure mercury lamp for 60 seconds. The plate is developed by spraying water and dried to 110° C. for 3 minutes to give a relief printing plate with protrudent dots in non-image areas.

EXAMPLE 6

An aluminum support material treated by alodine 1200 and coated by water soluble paint is provided with an array of protrudent dots by use of an embossing roll. The height of the dots is about 2 to 4 mils and the distribution density is about 700 per square centimeter.

The thus obtained aluminum sheet is used for the support material onto which is spread the photosensitive resin obtained in Example 1. The method of making of photopolymer plate is same as Example 2. The plate is bump exposed to the light of high pressure mercury lamp for 5 seconds from a distance of 70 cm. Then the plate is but in contact with a negative in a vacuum printing frame and exposed to the light of a high pressure mercury lamp for 60 seconds. The plate is developed by spraying water and dried to 110° C. for 3 minutes to give a relief printing plate with protrudent dots in the non-image areas.

Of course, it should be understood that various changes and modifications to the preferred embodiments described herein will be apparent to those skilled in the art. Such changes and modifications can be made without departing from the spirit and scope of the present invention and without diminishing its attendant advantages. It is, therefore, intended that such changes and modifications be covered by the following claims.

We claim:

1. A photopolymerizable element comprising a laminate of photosensitive composition supported on a substrate; said laminate including a first photopolymerizable layer adjacent said substrate and a second photopolymerizable layer disposed over said first layer; and said first layer including an array of preopolymerized portions distributed throughout substantially its entire area sufficient upon subsequent exposure and development of said photopolymeriable element to create a corresponding array of protrudent dots in the recessed background areas of the developed element, said protrudent dots having a height less than the height of the raised image areas of the developed element and a density sufficient to reduce the amount of bottoming in the developed element.

2. The photopolymerizable element of claim 1 wherein said array has a density in said first layer of at least 1 per square centimeter.

3. The photopolymerizable element of claim 1 wherein said array has a density in said first layer in the range of from about 100 to about 2000 per square centimeter.

4. The photopolymerizable element of claim 1 wherein each of said polymerized portions have an approximate transverse dimension of less than 0.008 inch.

5. The photopolymerizable element of claim 1 wherein said laminate has a thickness of less than about 0.020 inch.

6. The photopolymerizable element of claim 1 wherein said laminate has a thickness in the range of from about 0.005 to about 0.015 inch, said first layer has a thickness in the range of from about 0.001 to about 0.014 inch, and said second layer has a thickness in the range of from about 0.001 to about 0.014 inch.

7. The photopolymerizable element of claim 6 wherein said first layer has a thickness of about 0.004 inch and said second layer has a thickness of about 0.003 inch.

8. A photopolymerizable element comprising a laminate of photosensitive composition having a thickness less than about 0.020 inch and supported on a substrate; said laminate including a first photopoymerizable layer adjacent to said substrate and a second photopolymerizable layer disposed over said first layer; and said first layer including an array of prepolymerized portions throughout substantially its entire area, said array having a density in the range of from about 100 to about 2000 per square centimeter and being sufficient upon subsequent exposure and development of said photopolymerizable element to create a corresponding array of protrudent dots in the recessed background areas of the developed element, each of said protrudent dots having a transverse dimension less than about 0.008 inch and a height about 0.004 inch less than the height of the raised image areas of the developed element.

9. A photopolymerizable element comprising a layer of photosensitive composition supported on a substrate, said substrate having formed thereon an array of protrudent dots which extend into said photosensitive layer and which are sufficient upon subsequent exposure and development of said photopolymerizable element to create a corresponding array of protrudent dots in the recessed background areas of the developed element that extend to a height less than the height of the raised image areas of the developed element.

10. The photopolymerizable element of claim 9 wherein said substrate is a metallic sheet and said protrudent dots are embossed thereon.

11. The photopolymerizable element of claim 9 wherein said protrudent dots have a height in the range of from 0.002 to about 0.005 inch.

12. The photopolymerizable element of claim 9 wherein said array of protrudent dots has a density of at least 1 per square centimeter.

13. The photopolymerizable element of claim 9 wherein said array of protrudent dots has a density in the range of from about 50 to about 200 per square centimeter.

14. The photopolymerizable element of claim 9 wherein said photosensitive layer has a thickness of less than about 0.020 inch.

15. The photopolymerizable element of claim 9 wherein said photosensitive layer has a thickness of from about 0.005 to about 0.015 inch and said substrate is a metallic sheet having said protrudent dots embossed therein, said array of dots having a density of about 100 per square centimeter.

16. The photopolymerizable element of claim 15 wherein said protrudent dots have a height in the range of from about 0.002 to about 0.005 inch.

* * * * *